United States Patent
Tong et al.

(10) Patent No.: US 7,547,575 B2
(45) Date of Patent: Jun. 16, 2009

(54) TWO-STAGE DIE-BONDING METHOD FOR SIMULTANEOUS DIE-BONDING OF MULTIPLE DIES

(75) Inventors: Ho-Ming Tong, Taipei (TW); Kao-Ming Su, Kaohsiung (TW); Chao-Fu Weng, Tainan (TW); Teck-Chong Lee, Kaohsiung (TW); Chian-Chi Lin, Tainan (TW); Chia-Jung Tsai, Tainan (TW); Chih-Nan Wei, Kaohsiung (TW); Song-Fu Yang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/905,804

(22) Filed: Oct. 4, 2007

(65) Prior Publication Data

US 2008/0085571 A1  Apr. 10, 2008

(30) Foreign Application Priority Data

Oct. 5, 2006  (TW) .............................. 95137205 A

(51) Int. Cl.
*B29C 65/48* (2006.01)
*H01L 21/58* (2006.01)

(52) U.S. Cl. .................. 438/107; 156/499; 156/556; 257/E21.499

(58) Field of Classification Search ............... 438/107; 156/499, 556; 257/E21.499
See application file for complete search history.

(56) References Cited

U.S. PATENT DOCUMENTS

2004/0061346 A1* 4/2004 Capewell .................. 294/64.1
2004/0244915 A1* 12/2004 Lam et al. .................. 156/510

* cited by examiner

*Primary Examiner*—W. David Coleman
*Assistant Examiner*—Walter H Swanson
(74) *Attorney, Agent, or Firm*—Rabin & Berdo, P.C.

(57) ABSTRACT

A die bonder and a die bonding method thereof are provided. The die bonder includes a wafer platform, an arranging platform, a conveyer, at least one first pick-up device and a second pick-up device. The wafer platform is for placing a wafer with several dies. The conveyer is for carrying and conveying a substrate. The first pick-up device is for picking up one of the dies and placing each die on the arranging platform. The second pick-up device is for picking up the dies on the arranging platform and placing the dies on the substrate at the same time.

6 Claims, 3 Drawing Sheets

TWO-STAGE DIE-BONDING METHOD FOR SIMULTANEOUS DIE-BONDING OF MULTIPLE DIES

This application claims the benefit of Taiwan application Serial No. 095137205, filed Oct. 5, 2006, the subject matter of which is incorporated herein by reference.

BACKGROUND OF THE INVENTION

1. Field of the Invention

The invention relates in general to a die bonder and a die bonding method thereof, and more particularly to a two-stage die bonder bonding several dies on a substrate and a die bonding method thereof.

2. Description of the Related Art

As the technology develops continuously, the demands for all kinds of semiconductor packages increase rapidly. There are many different kinds of manufacturing processes of the semiconductor packages. A wire-bonding process is one of them and described briefly as follow. First, a wafer is separated into several dies by a wafer saw. Next, the die is bonded to a substrate by a die bonder. Then, bonding wires are connected with the die and the substrate by a wire-bonder. Afterwards, underfill is dispensed on the substrate by a dispenser for encapsulating the die, the substrate and the bonding wires. As a result, the damage to the die because of collision or moisture is avoided by the underfill.

In the die bonding step mentioned above, a pick-up device picks up the die and bonds the die on the substrate. In this step, the pick-up device only picks up one die at a time and then bonds the die on the substrate. This step is performed repeatedly until all the dies are bonded to the substrate.

However, the conventional pick-up device has to move back and forth between the wafer and the substrate to pick up one die at a time and then bond it to the substrate. It is very time-wasting. The manufacturing speed is low, and the productivity of the die bonder is limited.

SUMMARY OF THE INVENTION

The invention is directed to a die bonder and a die bonding method. A first pick-up device and a second pick-up device are used for performing a two-stage die-bonding process. There is no need to use only one pick-up device to move back and forth for bonding the dies. After the first pick-up device arranges the dies, the second pick-up device bonds several dies to the substrate at the same time. Therefore, the die bonding speed is increased significantly, and the manufacturing speed is increased accordingly.

According to the present invention, a die bonder is provided. The die bonder includes a wafer platform, an arranging platform, a conveyer, at least a first pick-up device and a second pick-up device. The wafer platform is used for placing a wafer including several dies. The conveyer is for carrying and conveying a substrate. The first pick-up device is for picking up one of the dies and arranging each die on the arranging platform. The second pick-up device is for picking up all the dies on the arranging platform and bonding the dies on the substrate at the same time.

According to the present invention, a die bonding method of a die bonder is provided. The die bonder includes a wafer platform, an arranging platform, a conveyer, at least a first pick-up device and a second pick-up device. The die bonding method includes following steps. First, in a step (a), a wafer is provided on the wafer platform. Next, in a step (b), a substrate is provided on the conveyer. Then, in a step (c), the first pick-up device picks up each die. Afterwards, in a step (d), the first pick-up device arranges the dies on the arranging platform. Subsequently, in a step (e), the second pick-up device picks up all the dies on the platform at the same time and bonding the dies on the substrate.

The invention will become apparent from the following detailed description of the preferred but non-limiting embodiments. The following description is made with reference to the accompanying drawings.

DETAILED DESCRIPTION OF THE INVENTION

Figure 1:
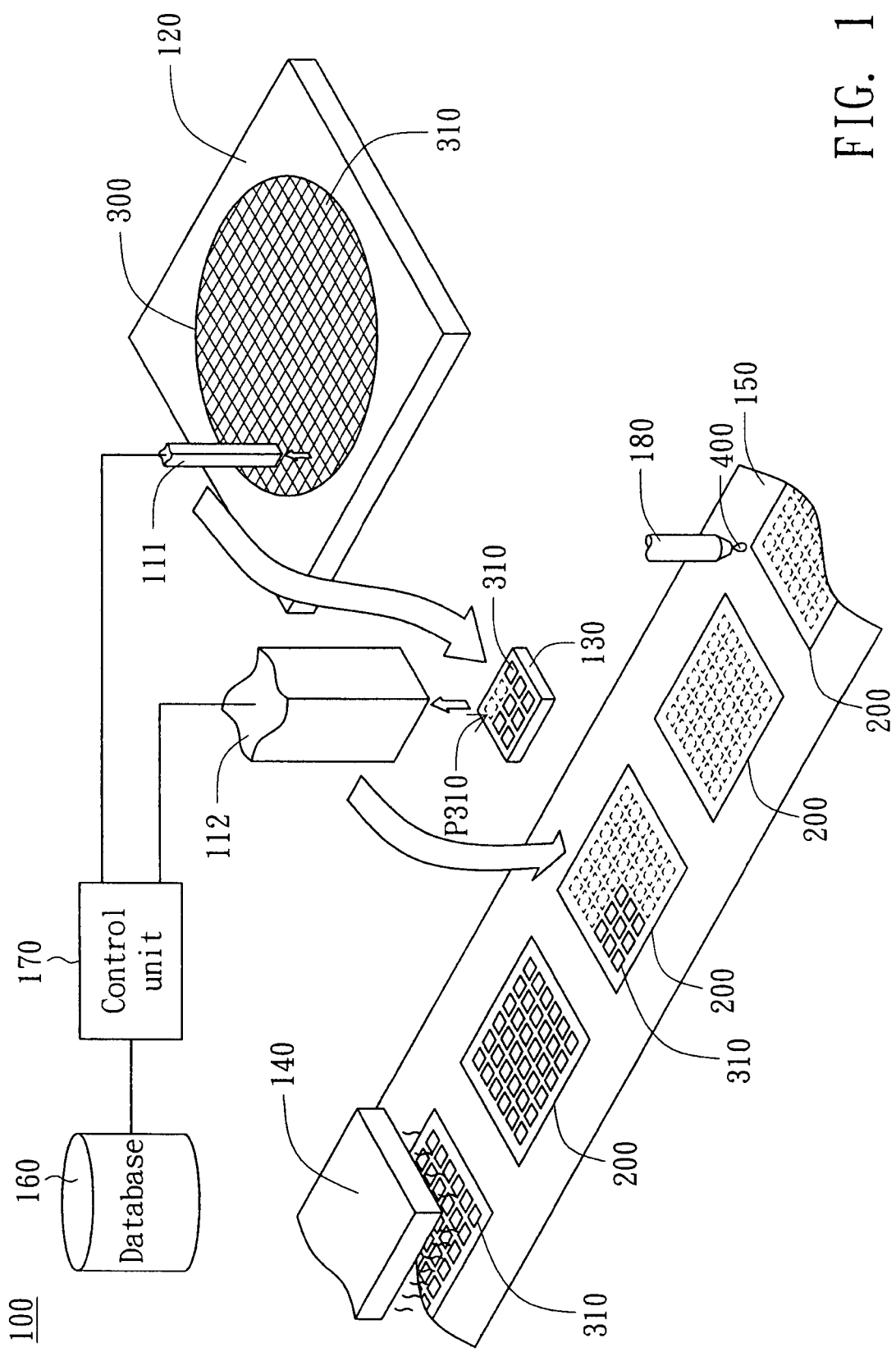
FIG. 1 illustrates a die bonder according to a preferred embodiment of the present invention.

Please refer to FIG. 1, a die bonder 100 according to a preferred embodiment of the present invention is illustrated in FIG. 1. The die bonder 100 at least includes a wafer platform 120, an arranging platform 130, a conveyer 150, a first pick-up device 111 and a second pick-up device 112. The wafer platform 120 is for placing a wafer 300. The wafer 300 includes several dies 310. The conveyer 150 is for conveying a substrate 200. The first pick-up device 111 is for picking up one of the dies 310 and arranging each die 310 on the arranging platform 130. The second pick-up device 112 is for picking up all the dies 310 on the arranging platform 130 at the same time and placing the dies 310 on the substrate 200.

As shown in FIG. 1, except the wafer platform 120, the arranging platform 130, the conveyer 150, the first pick-up device 111 and the second pick-up device 112, the die bonder 100 further includes a control unit 170, a database 160, a dispenser 180 and a heating device 140. In order to describe the function of each component, a die bonding method according to the present embodiment is illustrated as follow.

Figure 2:
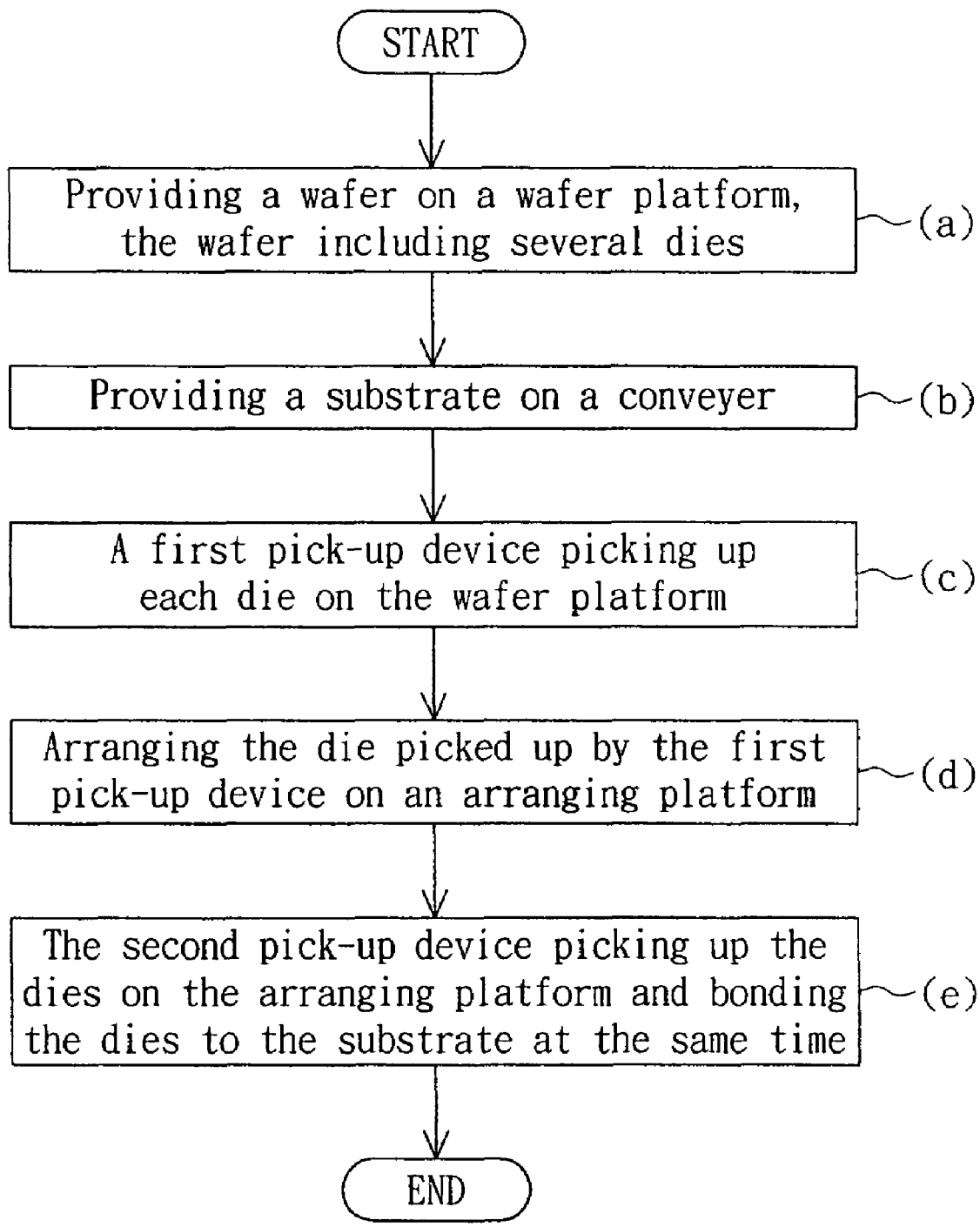
FIG. 2 is a flow chart of a die bonding method of the die bonder according to the preferred embodiment of the present invention.

Please refer to both FIG. 1 and FIG. 2. FIG. 2 is a flow chart of the die-bonding method of the die bonder 100 according to the preferred embodiment of the present invention. First, in a step (a), a wafer 300 is provided on the wafer platform 120. The wafer 300 is separated into several dies 310.

Figure 3:
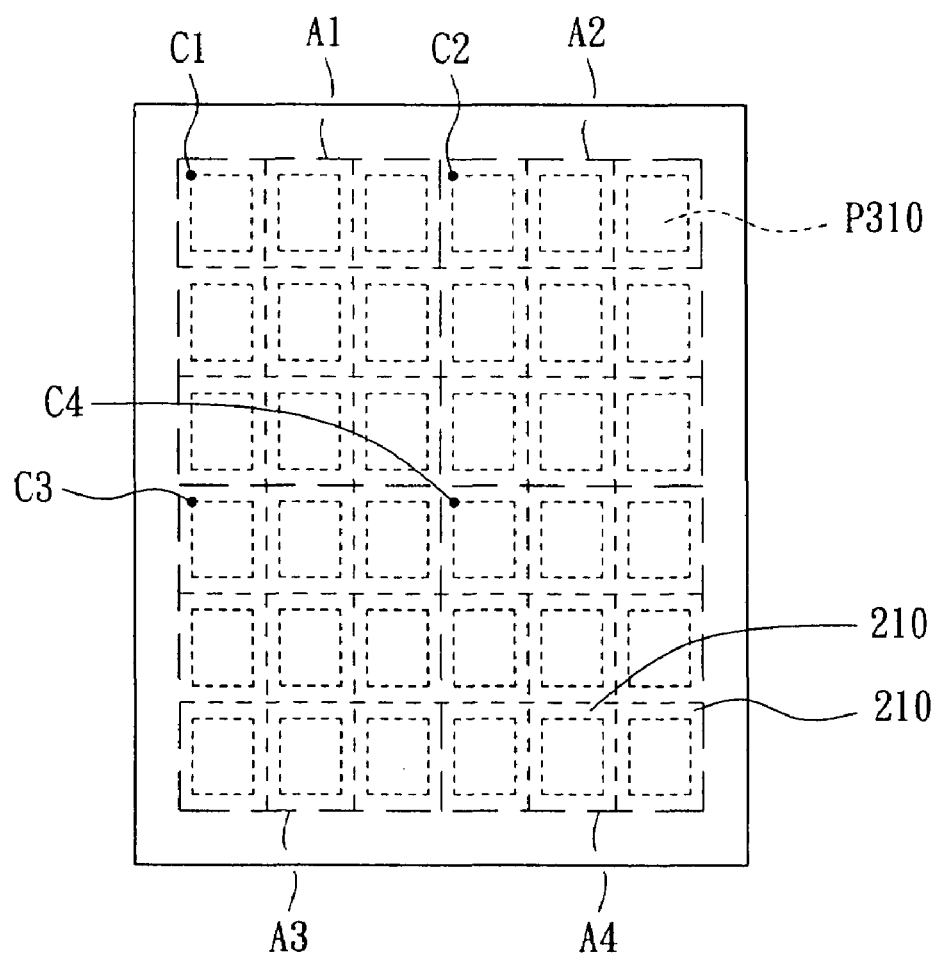
FIG. 3 illustrates the arrangement of package units of a substrate and dies on an arranging platform.
Figure 3:
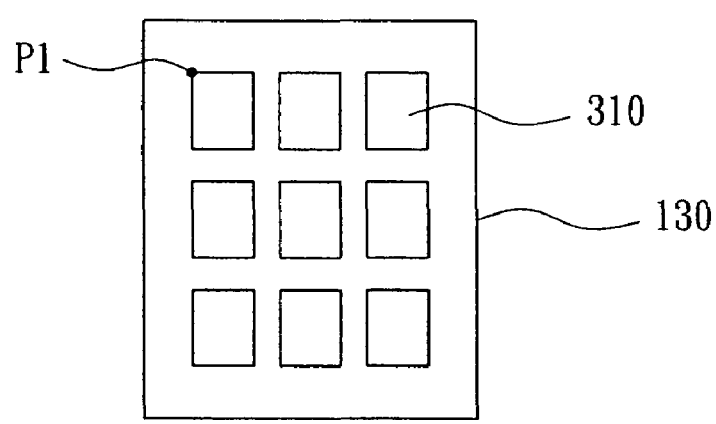

Next, in a step (b), a substrate 200 is provided on the conveyer 150. The substrate 200 includes several package units 210. Each package unit 210 is corresponding to a die-bonding position P310 (the package unit 210 is shown in FIG. 3). As shown in FIG. 1, the dispenser 180 dispenses an adhesive 400 on the substrate 200. The adhesive 400 is placed on each die-bonding position P310.

Then, in a step (c), the first pick-up device 111 picks up each die 310 on the wafer platform 120. As shown in FIG. 1, the control unit 170 is for controlling the first pick-up device 111 and the second pick-up device 112. The first pick-up device 111 picks up only one die 310 at a time. The second pick-up device 112 picks up several dies 310 at the same time. In this step, the control unit 170 drives the first pick-up device 111 to move over the wafer platform 120. After aligned to one die 310, the first pick-up device 111 picks up the die 310.

Afterwards, in a step (d), the first pick-up device 111 arranges the dies 310 on the arranging platform 130. Please refer to FIG. 3. The arrangement of the package units 210 of the substrate 200 and the dies 310 on the arranging platform 130 is shown in FIG. 3. In the present embodiment, there are thirty-six package units 210 on the substrate 200, and the package units 210 are arranged as 6×6 array. Each package unit 210 is corresponding to one die-bonding position P310. In other words, the substrate 200 includes thirty-six die-bonding positions P310. The data of the die-bonding positions P310 is stored in the database 160. The die-bonding positions P310 are divided into four regions A1, A2, A3 and A4. Nine die-bonding positions P310 are arranged in each region as a 3×3 array. The dies 310 arranged on the arranging platform 130 are corresponding to the nine die-bonding positions P310 in each region A1, A2, A3 or A4. Therefore, the number of the dies 310 on the arranging platform 130 is less than that of the die-bonding positions P310 on the substrate 200.

As shown in FIG. 1, in this step, the control unit 170 reads the data of the die-bonding positions P310 in the database 160 and drives the first pick-up device 111 to place each die 310 on the arranging platform 130 according to the arrangement of the die-bonding positions P310 in each region A1, A2, A3 or A4.

Later, in a step (e), the second pick-up device 112 picks up all the dies 310 on the arranging platform 130 at the same time and places the dies 310 on the substrate 200. As shown in FIG. 3, a positioning point C1, C2, C3 or C4 is defined in each region A1, A2, A3 or A4 on the substrate 200. The data of the positioning points C1, C2, C3 and C4 is stored in the database 160. Take FIG. 3 for example. After reading the data of the positioning point C1 in the database 160, the control unit 170 controls the second pick-up device 112 to align a positioning point P1 of the nine dies 310 to the positioning point C1. The nine dies 310 are placed on the substrate 200 at the same time.

As stated above, the nine dies 310 are arranged on the arranging platform 130 according to the arrangement of the die-bonding positions P310. The second pick-up device 112 places the nine dies 310 on the substrate 200 according to the positioning point C1, C2, C3 or C4 at the same time. Therefore, the nine dies 310 are placed accurately on the substrate 200 corresponding to the die-bonding positions P310.

Subsequently, as shown in FIG. 1, when the dies 310 are placed in all the die-bonding positions P310 on the substrate 200, the adhesive 400 on the substrate 200 is cured by the heating device 140. As a result, the dies 310 are bonded to the substrate 200.

Preferably, when the second pick-up device 112 places the dies 310 on the substrate 200, the first pick-up device 111 keeps on operating.

In the present embodiment, although one first pick-up device 111 is used in the die bonder 100, the number of the first pick-up device 111 is not limited thereto. The die bonder can include several first pick-up devices. All the first pick-up devices can operate at the same time according to the needs of the manufacturing process in order to obtain better efficiency.

Moreover, the package unit 210 is corresponding to one die-bonding position P310 as an example in the present embodiment. However, the number of die-bonding positions P310 that the package unit 210 is corresponding to is not limited thereto. Take a multi-chip module (MCM) for example. Each package unit is corresponding to several die-bonding positions. The die bonder and the die bonding method thereof of the present invention can also be applied to this type of package structure.

In the die bonder and the die-bonding method thereof according to the above embodiment of the present invention, the first pick-up device and the second pick-up device perform a two-stage die bonding process. There is no need for one pick-up device to move back and forth for picking up the dies one by one. After the first pick-up device arranges the dies on the arranging platform, the second pick-up device places several dies on the substrate at the same time. Therefore, the die-bonding speed is increased significantly.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A die bonding method of a die bonder, the die bonder comprising a wafer platform, an arranging platform, a conveyer, at least one first pick-up device and a second pick-up device, the method comprising:
   (a) providing a wafer on the wafer platform, the wafer comprising a plurality of dies;
   (b) providing a substrate on the conveyer;
   (c) the first pick-up device picking up each die on the wafer platform;
   (d) arranging the dies picked up by the first pick-up device on the arranging platform; and
   (e) the second pick-up device picking up the dies on the arranging platform at the same time and bonding the dies to the substrate.

2. The method according to claim 1, wherein the die bonder further comprises a database for storing data of a plurality of die-bonding positions, in the step (d), the first pick-up device arranging each die on the arranging platform according to the die-bonding positions.

3. The method according to claim 2, wherein the database further stores a positioning point, in the step (e), the second pick-up device bonding the dies on the substrate at the same time according to the positioning point.

4. The method according to claim 1, wherein in the step (d), the number of the dies arranged on the arranging platform is less than the number of the die-bonding positions of the substrate.

5. The method according to claim 1, wherein in the step (b), the substrate comprises a plurality of package units, each package unit corresponding to one die-bonding position.

6. The method according to claim 1, wherein in the step (b), the substrate comprises a plurality of package units, each package unit corresponding to a plurality of die-bonding positions.

* * * * *